(12) United States Patent
Weiblen et al.

(10) Patent No.: US 7,323,766 B2
(45) Date of Patent: Jan. 29, 2008

(54) SENSOR MODULE

(75) Inventors: Kurt Weiblen, Metzingen (DE); Franz Schmich, Pfullingen (DE); Harald Emmerich, Reutlingen (DE); Klaus Offterdinger, Stuttgart (DE); Hansjoerg Beutel, Reutlingen (DE); Johann Wehrmann, Balingen (DE); Florian Grabmaier, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 432 days.

(21) Appl. No.: 10/982,982

(22) Filed: Nov. 4, 2004

(65) Prior Publication Data

US 2005/0101161 A1    May 12, 2005

(30) Foreign Application Priority Data

Nov. 7, 2003    (DE) ................ 103 52 002

(51) Int. Cl.
*H01L 23/495* (2006.01)
(52) U.S. Cl. ....................... 257/666; 257/784
(58) Field of Classification Search ............... 257/666, 257/693, 696, 704, 784
See application file for complete search history.

(56) References Cited

U.S. PATENT DOCUMENTS

| 5,862,248 | A  | * | 1/1999  | Salatino et al. | ............ 382/124 |
| 6,670,221 | B2 | * | 12/2003 | Sakoda et al.   | ............ 438/112 |
| 6,953,891 | B2 | * | 10/2005 | Bolken et al.   | ............ 174/559 |
| 6,983,537 | B2 | * | 1/2006  | Park            | ............ 29/840  |

* cited by examiner

*Primary Examiner*—Thanh-Tam Le
(74) *Attorney, Agent, or Firm*—Kenyon & Kenyon LLP

(57) ABSTRACT

A sensor module, in particular for measuring an acceleration or rotational speed, having a housing base body made of a plastic material, a lead frame extending through the housing base body and having leads which have connector pins for attachment to a circuit board, a sensor system having at least one sensor chip, the sensor system being in contact with the lead frame via conductor bonds, a cover, which is connected to the base body and at least one connector pin and is made of a conductive material. A simple construction having a high shielding effect is achieved due to the fact that the conductive cover is connected to the connector pin. The cover, a lid, for example, may be contacted directly via the connector pin together with the other connector pins when the components are mounted on the circuit board. The sensor module may be molded or may have a premolded housing. The edge or a contact of the cover may be welded, soldered, glued, or pressed to a ground lead of the lead frame.

30 Claims, 10 Drawing Sheets

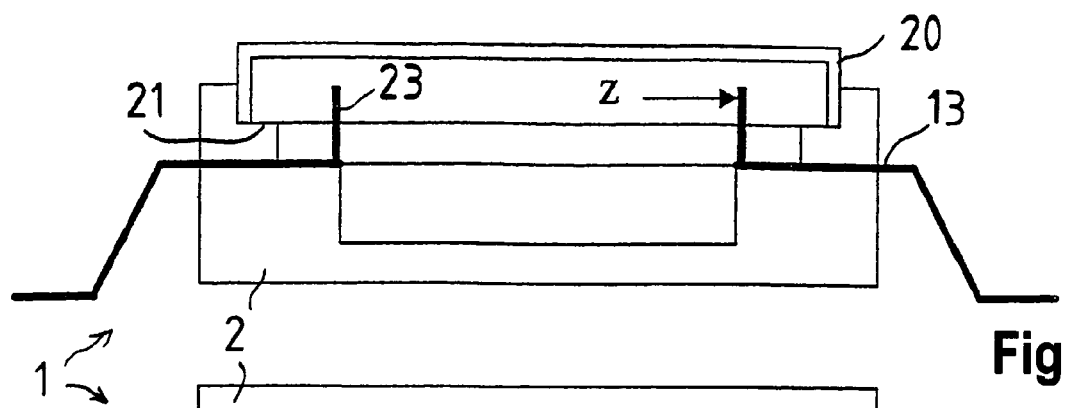
Fig. 2a
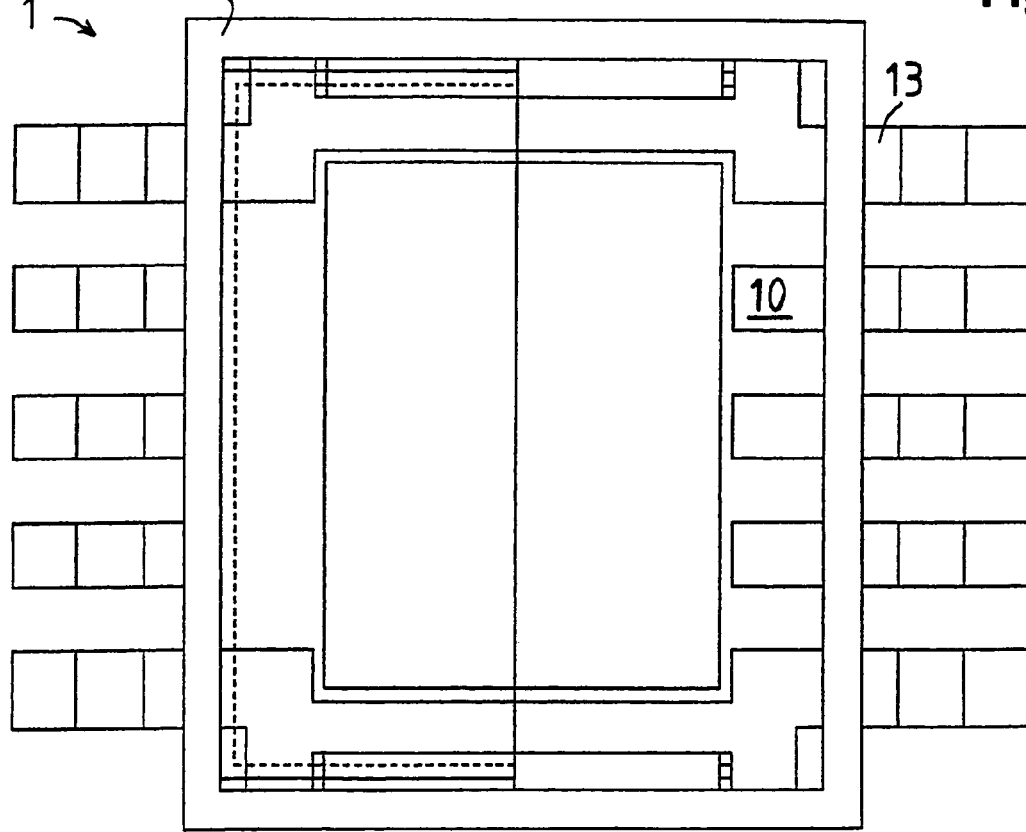
Fig. 2b
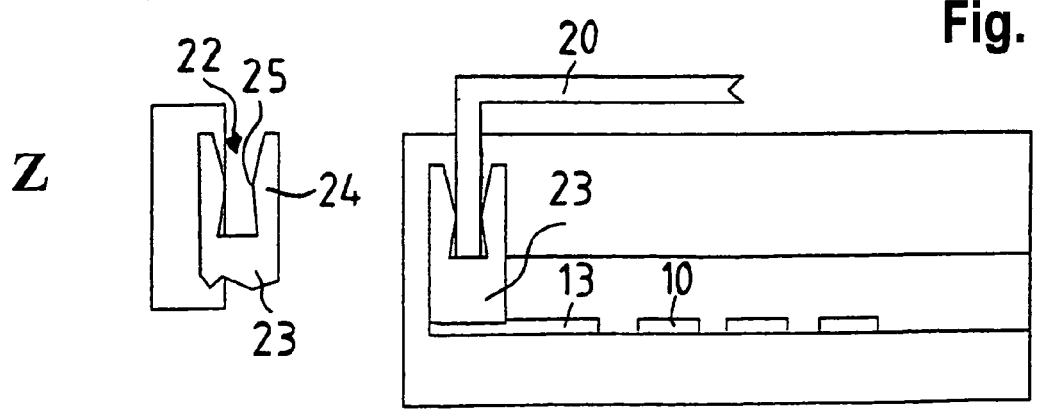

Fig. 3a
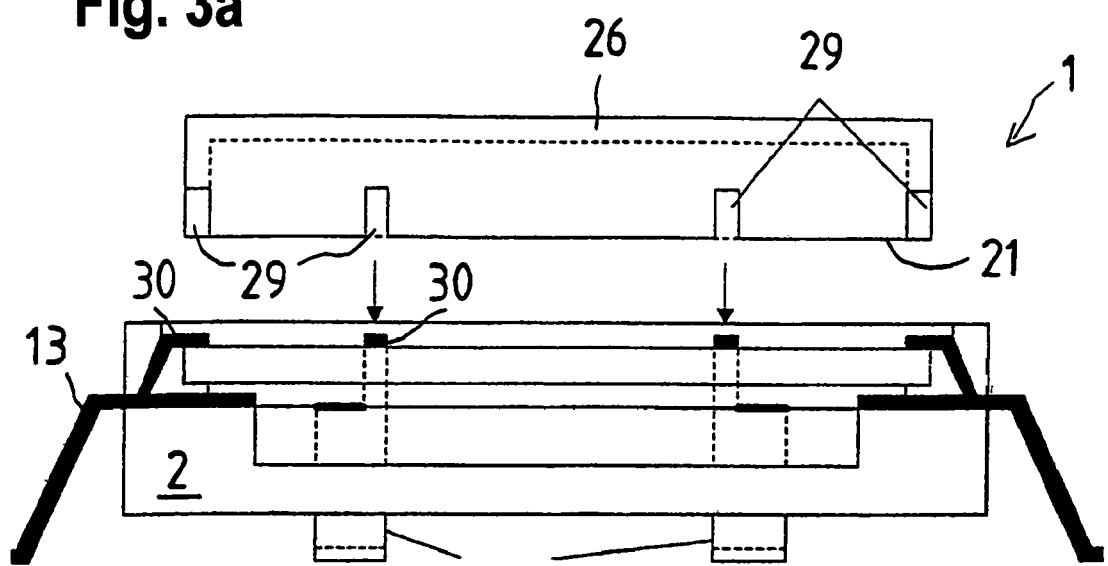
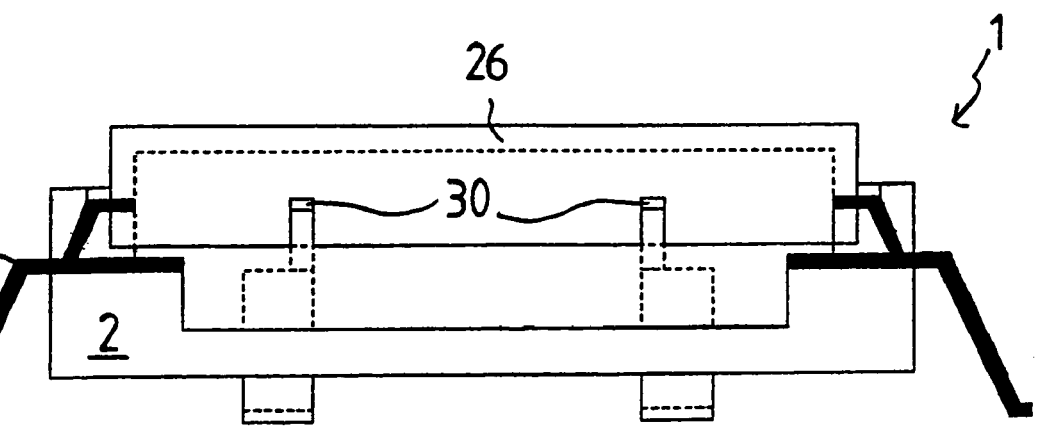
Fig. 3b

SENSOR MODULE

FIELD OF THE INVENTION

The present invention relates to a sensor module for measuring an acceleration or a rotational speed, in particular in conjunction with sensors sensitive to electromagnetic radiation.

BACKGROUND INFORMATION

Sensor modules to be mounted on a circuit board have, in general, a plastic housing and connector pins for contacting on the circuit board. The sensor chip or a sensor chip and an analyzer chip are either mounted on a lead frame and encapsulated in plastic or inserted into a premolded housing having an integrated lead frame which is sealed by a cover. In both systems, electromagnetic compatibility (EMC) is in general difficult to achieve via adequate shielding. This is a problem, for example, when using capacitively read sensors, for example micromechanically structured acceleration sensors and rotational speed sensors. EMC capacitors, an optimized printed conductor layout, external shields in the housing, or robust analyzer circuits and circuit principles may be used here; however, even using these measures, the demands for EMC in safety-critical applications, in the automobile industry in particular, are often not met, so that considerable optimizing efforts are needed for using the sensors in such safety-critical applications.

SUMMARY

A sensor module according to an example embodiment of the present invention may have the advantage that it is usable with standard circuit board mounting techniques, while making proper shielding of the sensor system against electromagnetic interference possible. Advantageously, it may have a relatively simple design and may be manufacturable in a simple and cost-effective manner.

According to the present invention, a simple design having a high degree of shielding may be achieved in a surprisingly simple manner by connecting a conductive cover, which, according to the present invention, may basically have some non-conductive regions in addition to conductive regions, to a connector pin, so that the cover may be contacted directly via the connector pin together with the other connector pins when the components are mounted on the circuit board. The cover may thus be brought to a defined potential, preferably to ground potential.

According to a first example embodiment, a premolded housing having a lower housing part and a cover may be used. The conductive cover is advantageously inserted into the lower housing part. According to an alternative second example embodiment, the lead frame and the sensor system may be encapsulated, a die pad connected to ground being able to be co-encapsulated underneath the sensor system to improve the shielding effect. One or more active or passive components, i.e., chips, may be accommodated in the housing.

The cover may be connected to a ground pin of the lead frame, to which ground connections of the sensor chip system are also connected. A separate cover connector pin may also be provided, which is formed on a web extending downward from the cover and may be contacted, for example, together with an adjacently situated ground pin of the lead frame.

The cover may be in contact with the lead frame, for example, via a pin bent upward for pressing in or clamping the cover or via similar support devices, for example lead forks of the lead frame.

Furthermore, the basic housing may be made of conductive plastic having insulating regions used as bushings for ungrounded pins of the lead frame, whereby proper shielding in all directions, i.e., complete all-around shielding, is achieved, which represents a considerable constructive simplification compared to known designs, for example using a steel module and glass bushings.

In molded sensor modules, the conductive cover is either subsequently mounted or is already fused into the plastic base body. In the case of premolded housings, the cover may be pressed in, clipped in, glued in, glued on, or directly soldered on.

The cover may be flush-fitted into, placed onto, or drawn laterally deeper into the component for all types of connection and for premolded as well as molded modules. By bending the conductive cover also downward and extending it, a complete all-around shielding may be achieved by the conductive metallic regions connected to the electric ground.

According to an example embodiment of the present invention, a plurality of ground pins bent toward the cover may also form a grid of leads for reducing the lateral EMC radiation.

The conductive cover may be, for example, a lid, in particular a deep-drawn lid, an electrically conductive imprint, a sheet, or a coating. It may be manufactured entirely of a conductive material or have a conductive dispersion in a non-conductive matrix and/or a conductive coating; however, the required shielding is also achieved.

The conductive cover is advantageously formed in such a way that it forms a component pin after assembly, hot caulking, for example.

A ground surface is advantageously also provided on the circuit board underneath the sensor module.

According to one example embodiment, a contact is formed between the conductive cover and the ground pin of the lead frame by a channel in the housing wall of the premolded lower housing part, orifices in the cover and ground pin and a contact extending through the channel and the orifices, in particular an introduced conductive adhesive or contact pin.

BRIEF DESCRIPTION OF THE DRAWINGS

The present invention is explained in detail below using several embodiments with reference to the drawings.

FIGS. 2a and b show a sectional view and a top view of another example embodiment of a sensor module having a premolded housing and pressed-in cover with the cover partially open and detail Z.

FIGS. 3a, b show a sectional view before and after assembly of a sensor module according to another example embodiment having a premolded housing and lead ends penetrating into the cover.

FIG. 8b shows a sectional front view of the embodiment of FIG. 8a.

DETAILED DESCRIPTION OF EXAMPLE EMBODIMENTS

Figure 1A:
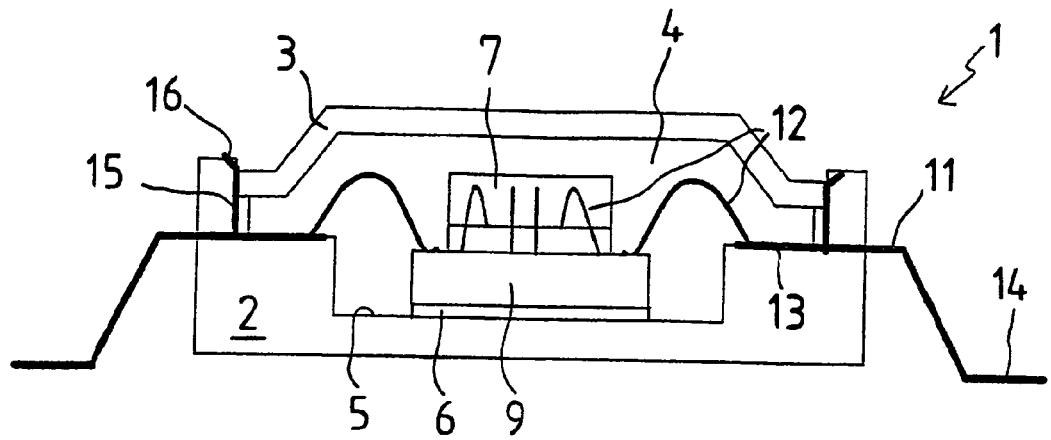
FIGS. 1a, b show a sectional view and a top view with the cover partially open of a sensor module according to a first example embodiment having a premolded housing and clamped cover.

FIGS. 1a, b show a sensor module 1 has a premolded housing 2, 3 having a lower housing part 2 made of plastic and a metallic cover 3, between which an internal space 4 is formed. A sensor chip 7 and an analyzer chip 9, for example an ASIC (application-specific integrated circuit), are glued in interior space 4 on an internal surface 6 of lower housing part 2 using adhesive layers 6; the sensor chip and the analyzer chip are connected to one another and to contact regions of leads 10, 13 of a lead frame 11 via conductor bonds 12 in an essentially known manner. Lead frame 11 extends through lower housing part 2 and has ground leads 13 and further leads 10, whose outer ends transition into connector pins 14 protruding downward for attachment to a circuit board, which is not shown.

Sensor chip 7 may be in particular a microstructured component, for example, an acceleration sensor having vertical plates, which are deformed, according to their elasticity, under the effect of acceleration and rotational speed, a measuring signal being capacitively read by analyzer circuit 9. Interior space 4 may be empty or filled with air or partially filled with a protective compound such as a gel or may be fully cast.

According to an example embodiment of the present invention, lead frame 11 has metal lugs (leads) 15 protruding at least in part upward and having bent or crimped ends 16. Metal lugs 15 are used to receive metal cover 3, which they clamp in between them when inserted as shown. Ends 16 of metal lugs 15 are bent outward, so that cover 3 self-centers when inserted from above. Metal lugs 15 may stand out freely or extend through lower housing part 2 in a lower area. According to the example embodiment of the present invention, metallic cover 3 is thus electrically connected via metal lugs 15 to ground leads 13, which are also used as the ground connector of analyzer chip 9 and may thus be connected to ground contacts, i.e., ground surfaces of a circuit board.

Figure 1B:
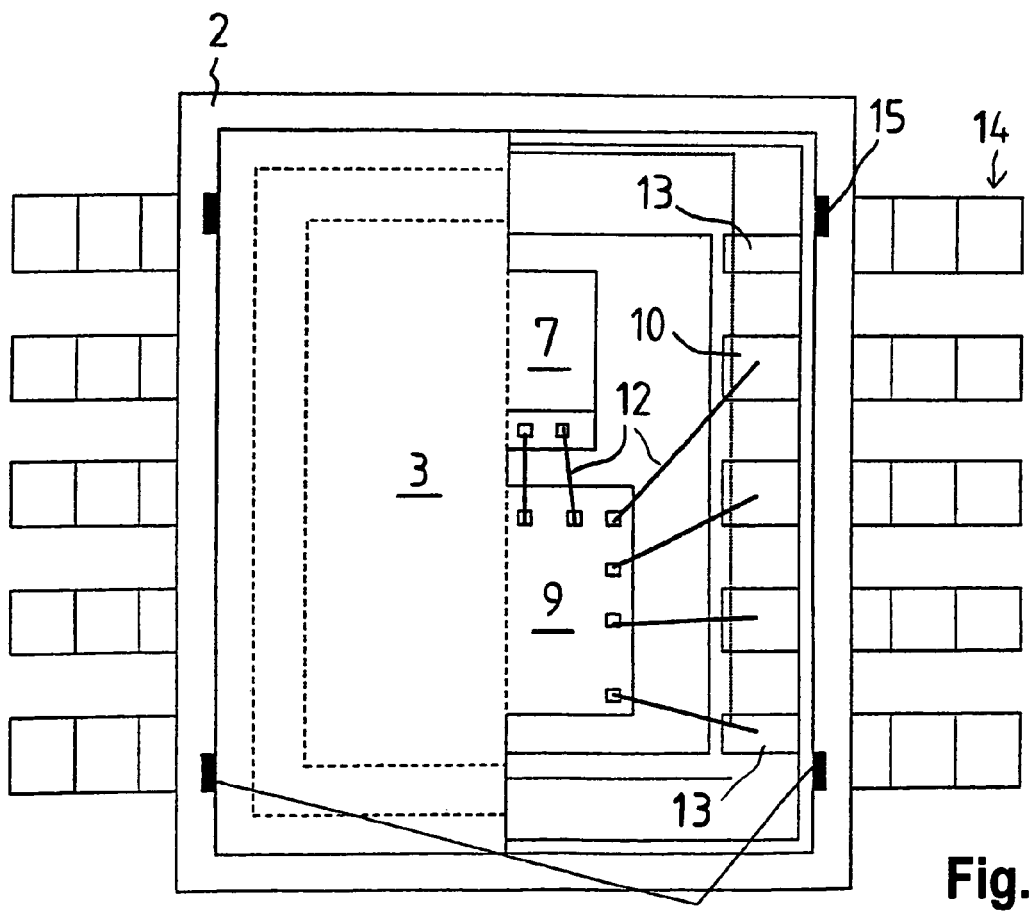

In the example embodiment shown in FIG. 2, conductive cover 20 is also placed on lower housing part 2, its lower edge 21 being pressed into a plurality, for example, four, lead forks 23, clamped thereby and in contact with ground leads 13 via lead forks 23. The chips are omitted in this illustration for the sake of clarity; however, they may be fastened by gluing in lower housing part 2 according to FIG. 1 and they are in contact with the leads of lead frame 11. Each lead fork 23 has two metal lugs 24 protruding upward, which define an opening 22 for receiving lower cover edge 21 and, toward the center, transition into projections 25 which may be tapered, for example. The metal lugs thus elastically receive the inserted lower cover edge 21. Alternatively to the example embodiment shown, cover 20 may also be placed into the additionally provided webs of lead forks 23, protruding downward, instead of into its lower edges 21.

In the example embodiment shown in FIG. 3, metallic cover 26 has slots 29 on its lower edge 21, into which lead ends 30 of ground leads 13 penetrate when the cover is installed. As evident from FIG. 3b, this ensures a large contact surface between the metallic cover and ground leads 13, which extends over the entire circumference of slots 29.

Figure 4A:
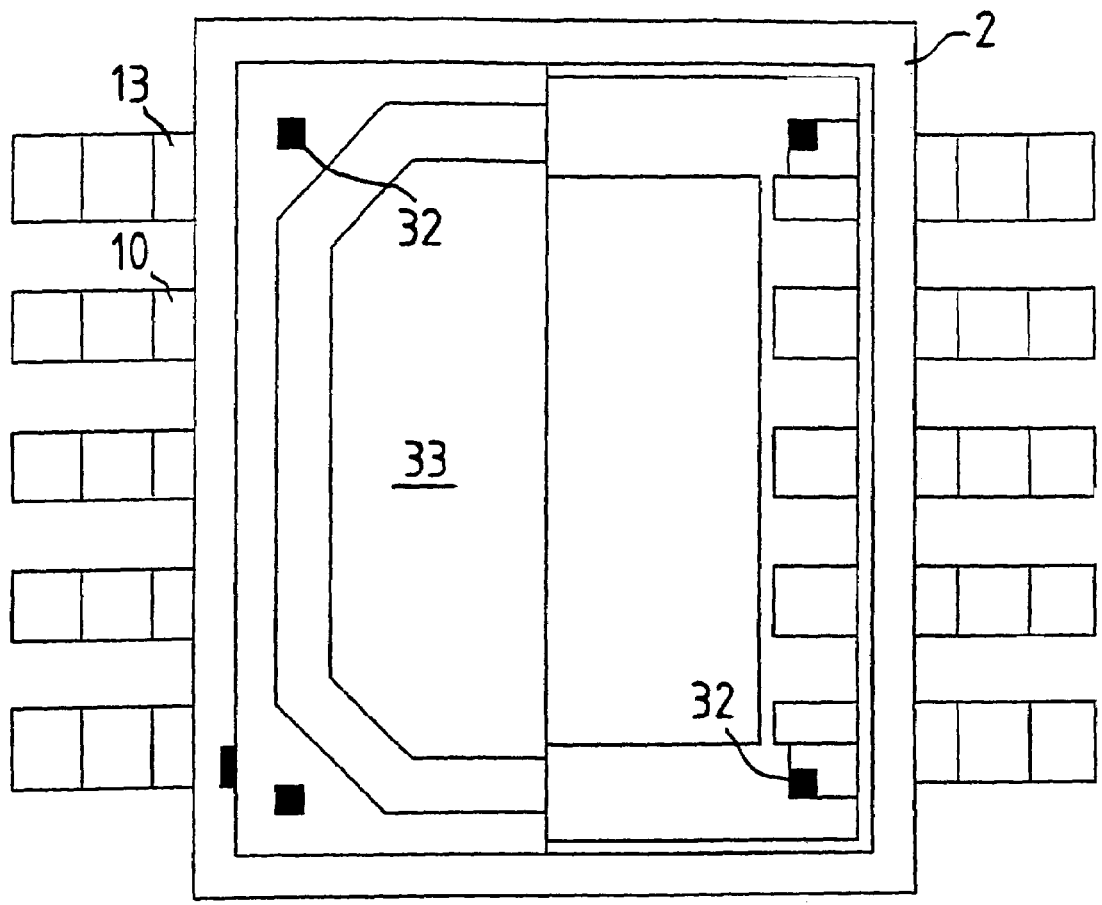
FIGS. 4a, b show a sensor module according to another example embodiment having a premolded housing pressed into press-in pins.
Figure 4B:
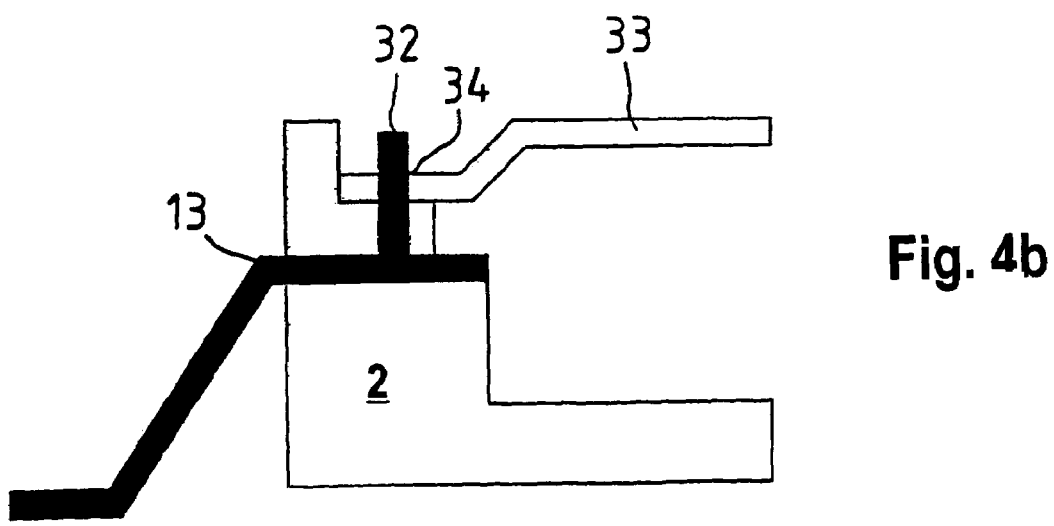

In the example embodiment shown in FIG. 4, the ends of ground leads 13 are molded to form press-in pins 32, which protrude vertically from lower housing part 2. Metallic cover 33 has orifices 34, into which press-in pins 32 are inserted when the cover is installed. Press-in pins 32 of ground lead 13 are thus used both for attaching and securing, as well as for electrically contacting metallic cover 33.

Figure 5A:
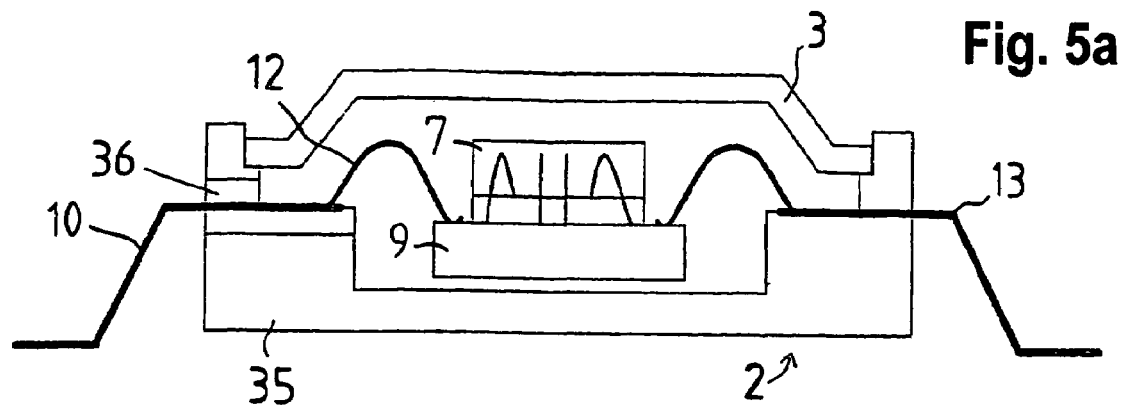
FIGS. 5a, b show a sensor module according to another example embodiment having a premolded housing having conductive regions.
Figure 5B:
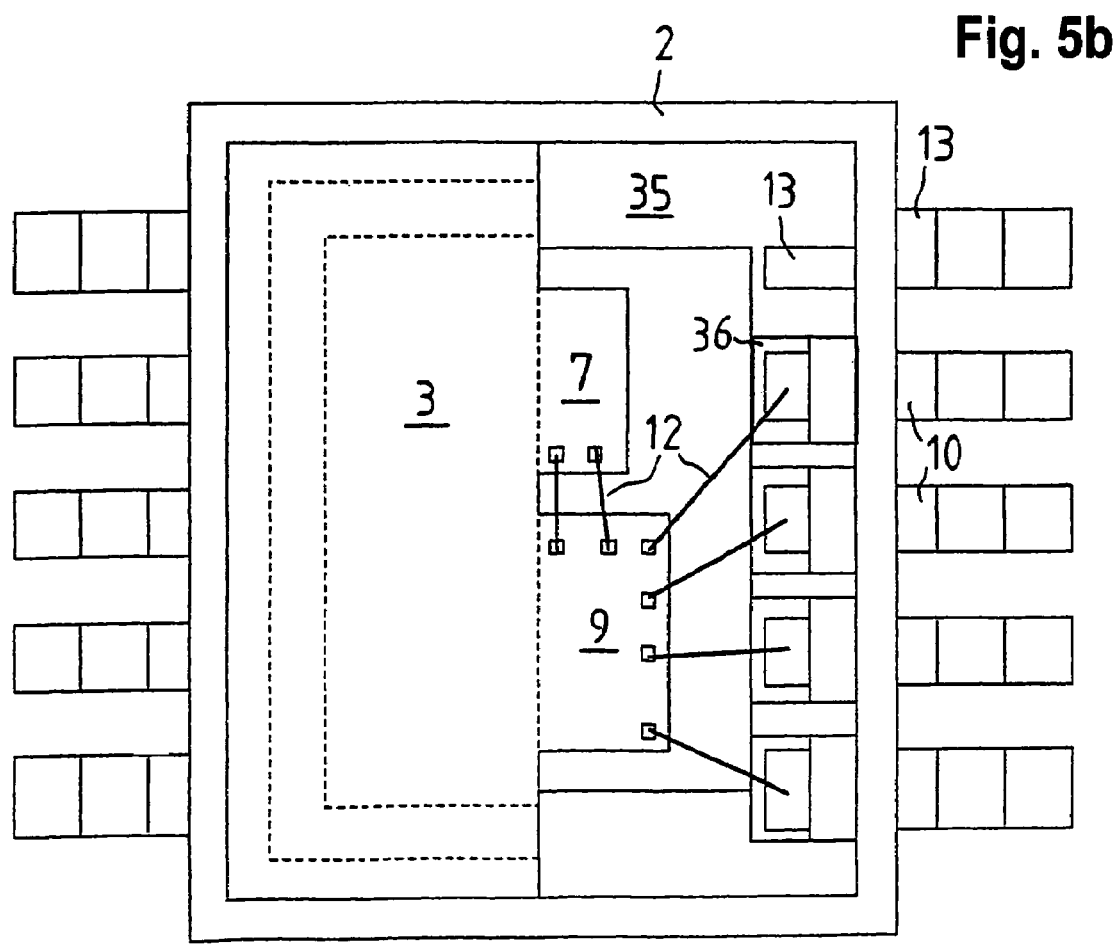

In the example embodiment of FIG. 5, lower housing part 2 has a conductive region 35 made of a conductive plastic or of a plastic material provided with conductive additives such as fibers, and insulating regions 36 made of electrically insulating plastic. According to the left side of FIG. 5a, insulating regions 36 of lower housing part 2 surround leads 10, which are not connected to ground, so that electrical contacting of chips 7, 9 is possible via conductor bonds 12 to leads 10. Insulating regions 36 are thus used as bushings of leads 10 through otherwise conductive lower housing part 2. As the right-hand side of FIG. 5a shows, ground pins 13 pass through conductive region 35 of lower housing part 2 without electrical insulation, so that conductive region 35 of lower housing part 2 and connected conductive cover 3 made of metal or a conductive plastic are electrically connected with one another and with ground pins 13. In this example embodiment, even and complete shielding of chips 7, 9 up to small insulating regions 36 is thus possible.

Figure 6A:
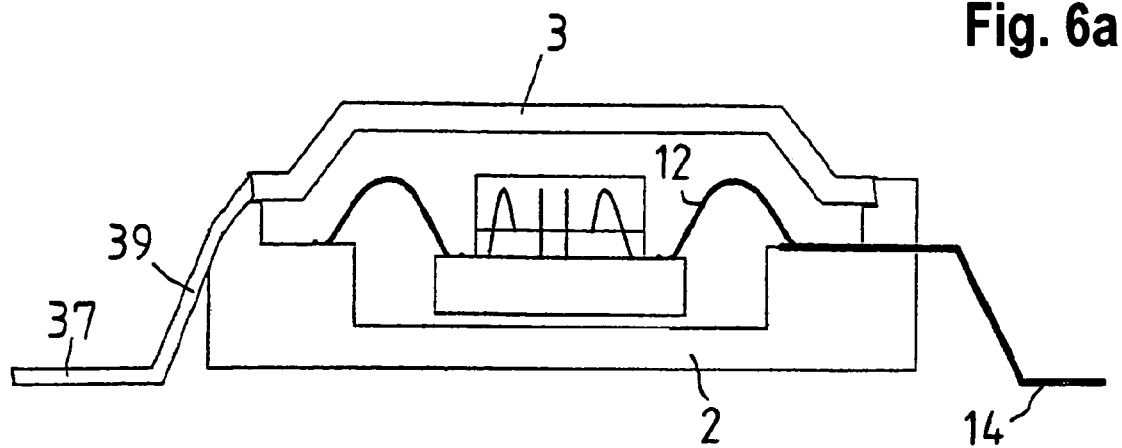
FIGS. 6a, b show a sensor module according to another example embodiment having a premolded housing made up of a lower part and a conductive cover.
Figure 6B:
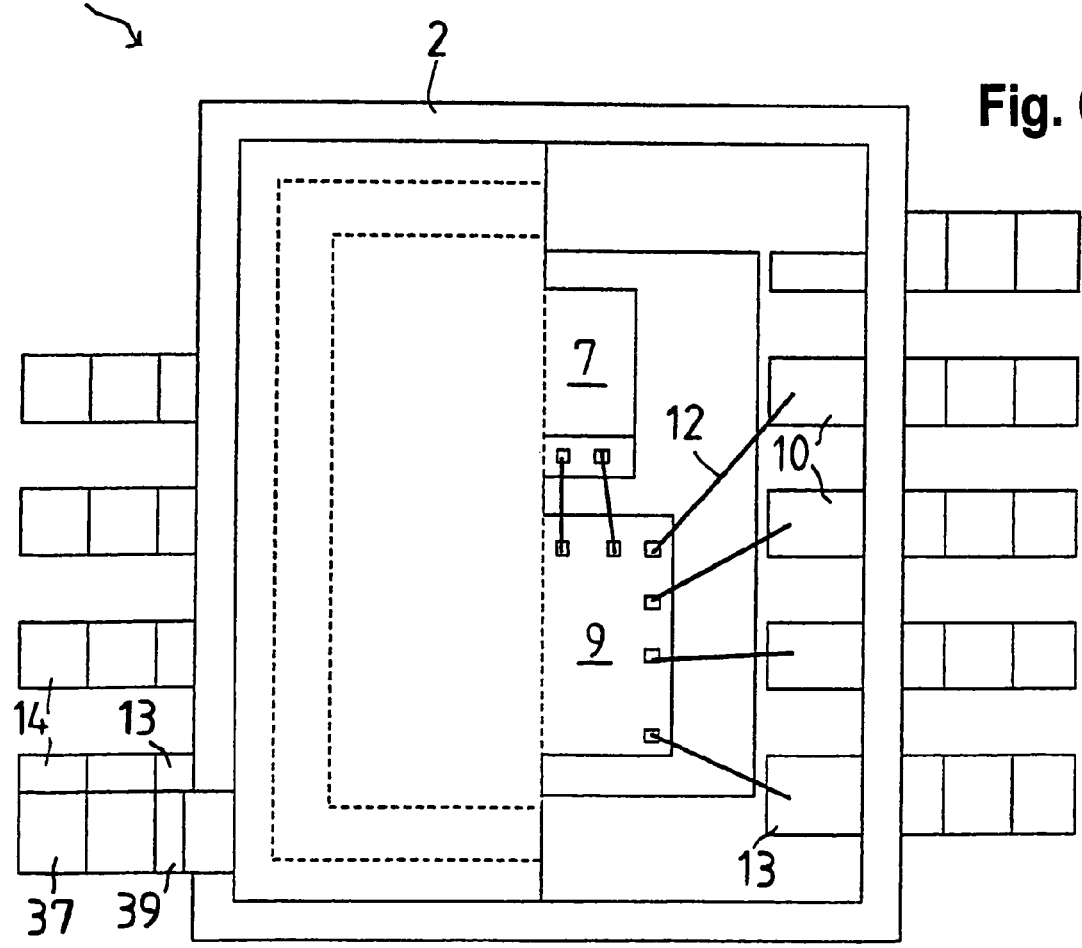

In the example embodiment of FIG. 6, a web 39 made of metal, for example, is attached to cover 3 made of conductive material, e.g., metal or conductive plastic, and extends to the level of connector pins 14 of lead frames 11, i.e., is bent downward and thus transitions there into a connector pin 37. As an alternative to this two-part construction, cover 3 and web 39 may also be manufactured as one part made of a conductive material. When mounting components on a circuit board, module 1 may thus be in contact with jointly contacting connector pins 14, 37 of ground leads 13 and web 39.

In the example embodiment of FIGS. 7a-d, sensor modules in which lead frame 11 having chips 7, 9 are directly fused, i.e., molded, into the plastic material, form a plastic base body 40 of non-conductive plastic, from which connector pins 14 of leads 10, 13 protrude. The component thus molded may be used directly for mounting onto a circuit board in a conventional manner. According to the present invention, a cover 41, 42 made of conductive material, for example, metal or conductive plastic, is installed.

Figure 7:
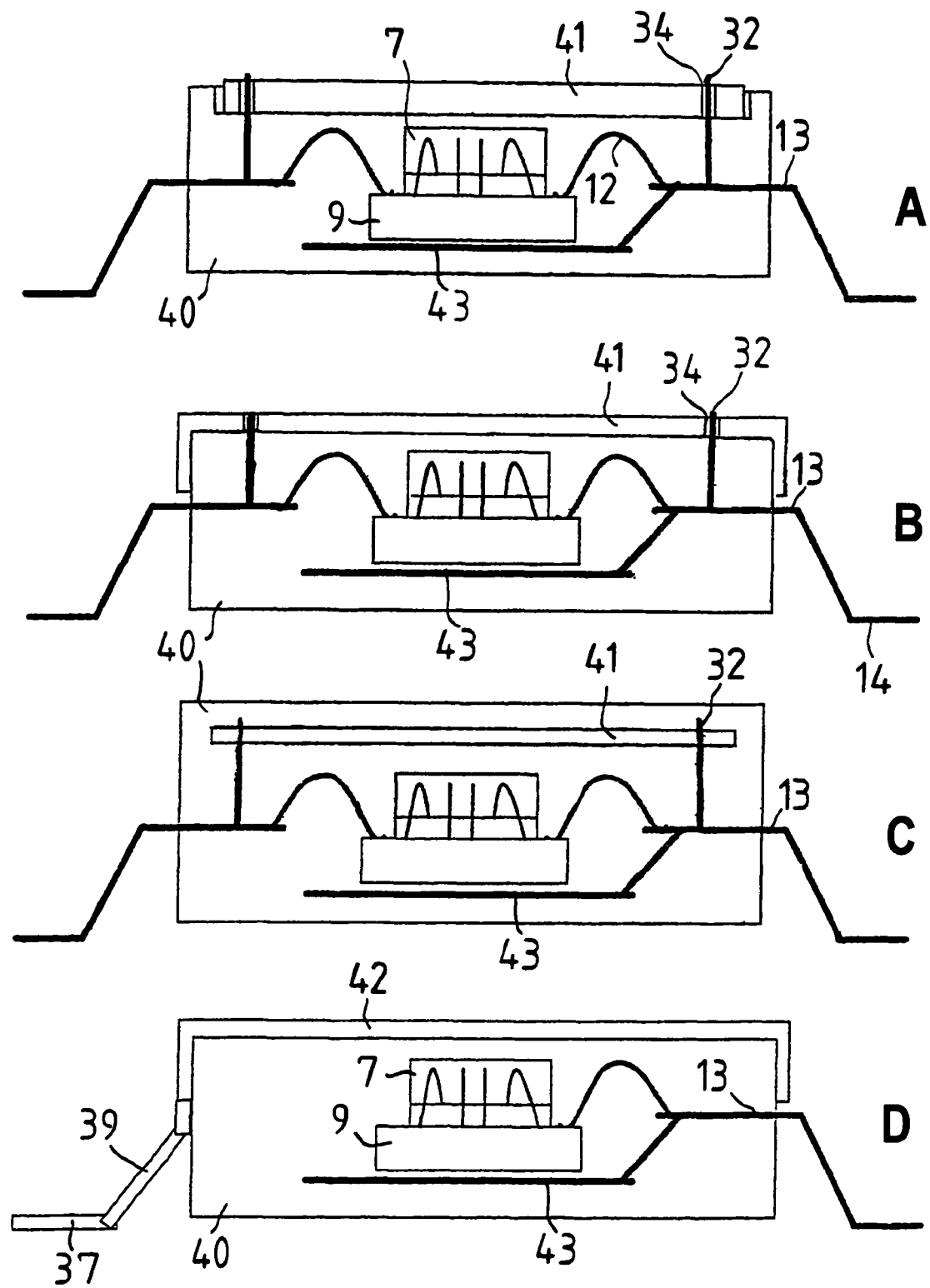
FIGS. 7a-d show different example embodiments having molded components in a sectional view.

In the example embodiments of FIGS. 7*a-c*, conductive cover 41 is contacted, as in the embodiment of FIG. 4, via press-in pins 32, which are used for contacting at the same time. In FIG. 7*a*, cover 41 rests on plastic base body 40; in FIG. 7*b*, cover 41 is drawn over the edge of plastic base body 40; in the example embodiment of FIG. 7*c*, conductive cover 41 is initially placed on press-in pins 32, and plastic base body 40 is only extruded later, so that cover 41 is extrusion-molded into plastic base body 40. In the example embodiment of FIG. 7*d*, conductive cover 42 is contacted via a web 39 using cover connector pin 37 as in the embodiment of FIG. 6. Cover 42 is subsequently placed on plastic base body 40 and contacted on the circuit board via cover connector pin 37 together with a connector pin 14 of a ground lead 13.

In all example embodiments 7*a* through d, a die pad 43 connected to ground leads 13 may be advantageously molded into plastic body 40 underneath sensor system 7, 9 and conductor bonds 12, thereby further enhancing the shielding effect.

In the example embodiment having a premolded lower housing part, a conductive element, for example, a die pad, may also be fused into the premolded lower housing part underneath the sensor system to increase the shielding effect.

The example embodiments of FIGS. 1 through 6 may also be combined to enhance the ground connection and/or the clamping effect; the embodiments of FIGS. 7*a* through 7*d* may be similarly combined.

Figure 8A:
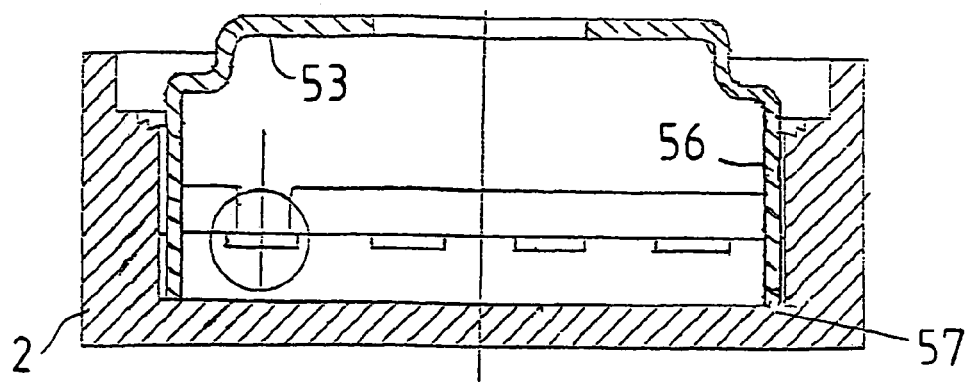
FIG. 8a shows a lateral sectional view of another example embodiment having a premolded housing made up of a lower part and an inserted conductive cover.
Figure 8B:
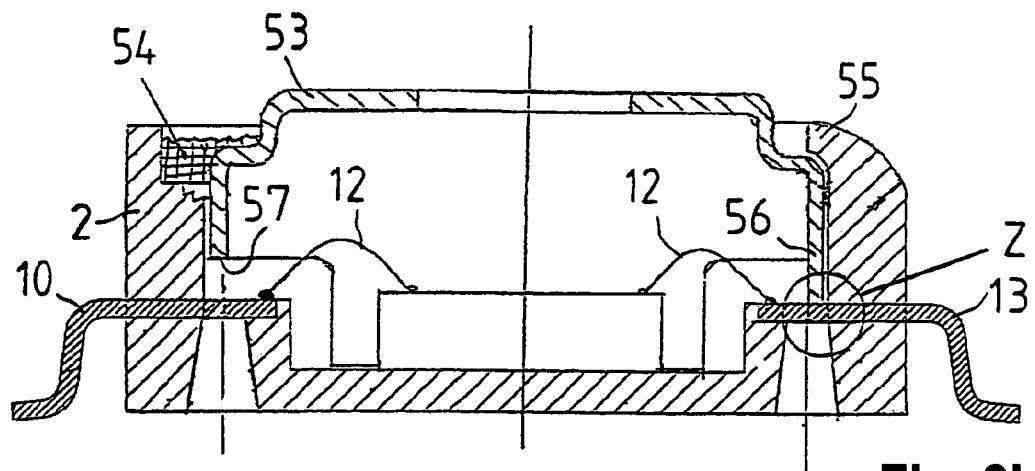

The example embodiment shown in FIGS. 8*a*, *b* through 9 has a premolded lower housing part 2 made of non-conductive plastic and a cover 53 inserted in the lower housing part and made of a conductive material having generally vertical walls 56. Cover 53 may be manufactured as an inexpensive deep-drawn part of sheet metal. Furthermore, it may also be manufactured by stamping and subsequent bending, for example. It may be connected to lower housing part 2 according to the left-hand side of FIG. 8*b* by an adhesive bond 54 or, according to the right-hand side of FIG. 8*b*, a form-locked connection, for example, a flange 55 of lower housing part 2 as shown.

According to FIG. 8*a*, lower cover edge 57 of walls 56 rests on inner surface 6 of lower housing part 2 front and back. According to FIG. 8*b*, left-hand side, cover edge 57 ends above ungrounded leads 10 toward the sides, and, according to FIG. 8*b*, right-hand side, it is electrically connected to ground leads 13. Effective shielding is achieved toward the front, rear, and sides via walls 56 of cover 53.

Cover edge 57 may be attached to ground lead 13 in different ways. Initially it may be placed on ground lead 13 according to FIG. 9 and welded, soldered, or secured via conductive adhesive 60. When conductive adhesive 60 is used, it is metered onto ground lead 13 prior to the placing of cover 53; contact 59 is then pressed into wet conductive adhesive 60 and the adhesive is then hardened.

Cover 53 may be advantageously welded to ground lead 13 via electric welding by generating a current between cover 53 and ground lead 13 using electrodes, bonding the two parts together.

Figure 9A:
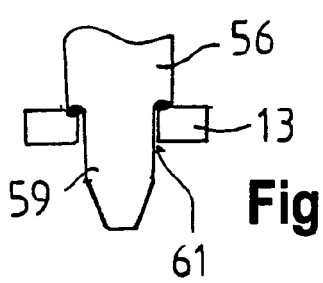
FIGS. 9a-d show different example embodiments of details Z of FIG. 8b.
Figure 9C:
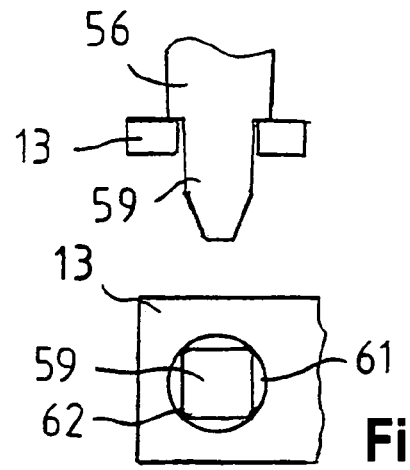
Figure 9B:
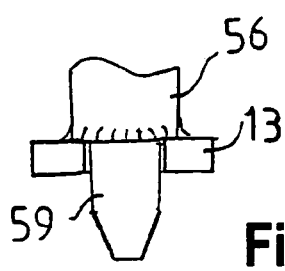
Figure 9D:
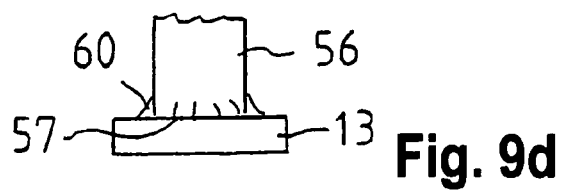

Alternatively, a contact 59 may be formed, molded, or mounted on cover edge 57 according to FIGS. 9*a* through *c*, and inserted into an orifice 61 of ground lead 13. Cover edge 57, i.e., contact 59, is welded to ground lead 13 in the embodiment of FIG. 9*a*, and glued using conductive adhesive 60 in FIG. 9*b*; the procedure of FIG. 9*d* may be used here. In the example embodiment of FIG. 9*c*, contact 59 has a rectangular shape and is pressed into orifice 61. Contact 59 and orifice 61 are dimensioned such that four corners 62 are deformed when pressed in, forming the electric contacts.

Figure 10:
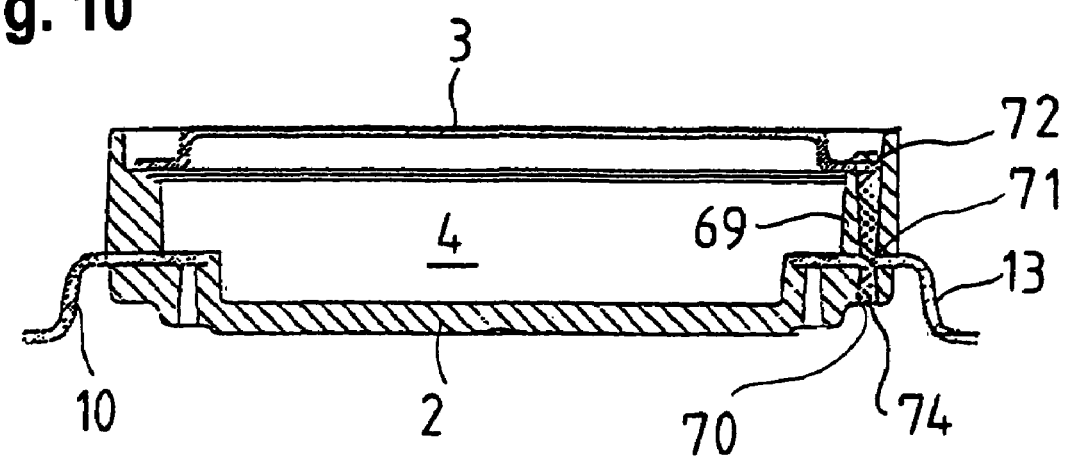
FIG. 10 shows a sectional view of another example embodiment having a premolded housing, a conductive cover, and contacting via a channel using a conductive adhesive.

The example embodiment of FIG. 10 shows an embodiment having premolded lower housing part 2 and conductive cover 3 placed on it; in contrast to the example embodiments of FIGS. 1 through 6, contact between ground pin 13 of the lead frame and cover 3 is achieved here via housing wall 69 of lower housing part 2. For this purpose, a channel 70, i.e., passage, from the bottom to the top, is formed in housing wall 69. Furthermore, an orifice 71 is formed in ground pin 13 of the lead frame and an orifice 72 is formed in cover 3, these orifices being flush with channel 70. A conductive adhesive is introduced in channel 70 and orifices 71, 72 to establish a conductive adhesive contact 74 between cover 3 and ground pin 13. Channel 70 in lower housing part 2 may be formed directly in housing wall 69 during the extrusion process of premolded lower housing part 2; orifices 71, 72 may also be pre-manufactured or drilled before contacting with the cover in place. After positioning cover 3, the conductive adhesive is dispensed through orifice 72 in cover 3, the openness of channel 70 and orifices 71, 72 allowing air to escape downward.

Figure 11:
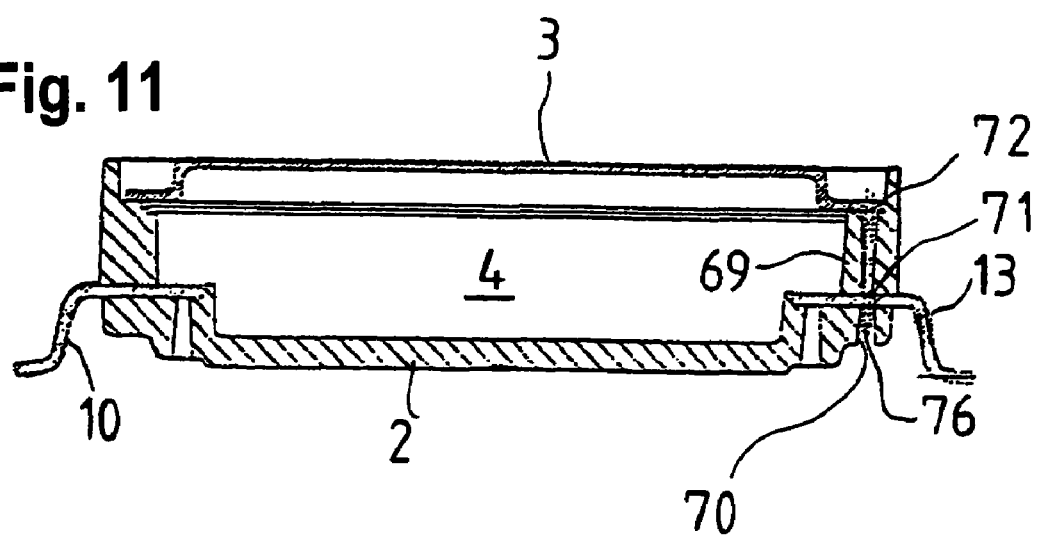
FIG. 11 shows a sectional view of another example embodiment having a premolded housing, a conductive cover, and contacting via a contact pin inserted into a channel.

In the example embodiment of FIG. 11, channel 70 and orifices 71, 72 are formed similarly to FIG. 10. A contact pin 76 is then introduced into channel 70 and orifices 71, 72 to establish the contact between ground pin 13 of the lead frame and cover 3.

Figure 12A:
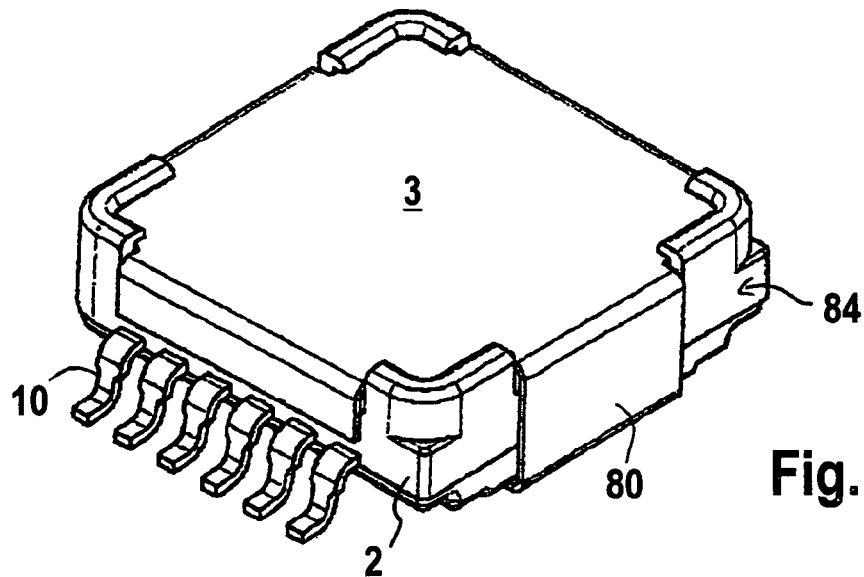
FIGS. 12a, b, c show a perspective top view, a perspective bottom view, and an exploded view of another example embodiment having a premolded housing and a conductive cover.
Figure 12B:
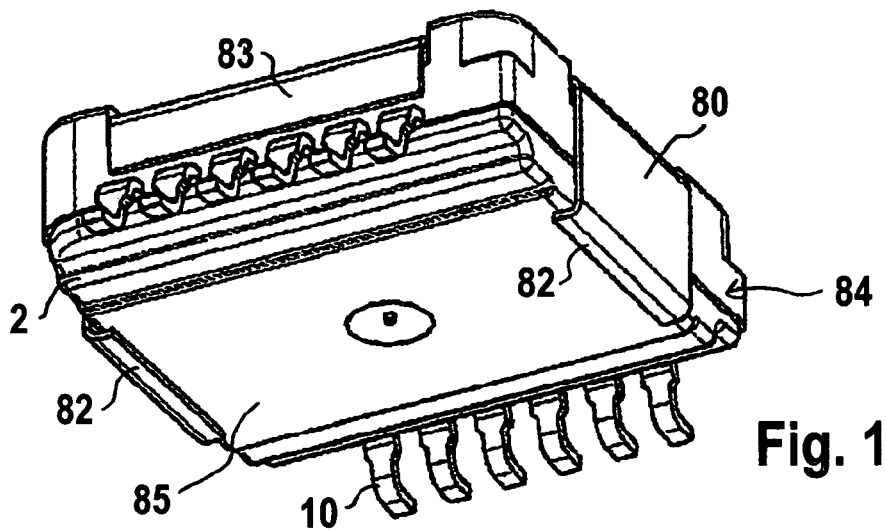

In the example embodiment of FIG. 12*a*, b, c, conductive cover 3 has a clip arm 80, which grips lower housing part 2 from behind by its lateral areas 84 which are free of leads 10, using a rear gripping area 82, and forms a positive lock between cover 3 and lower housing part 2. Alternatively to gripping the entire lower housing part 2 from behind as shown, a groove in the side wall of lower housing part 2 may also be gripped from behind.

Figure 12C:
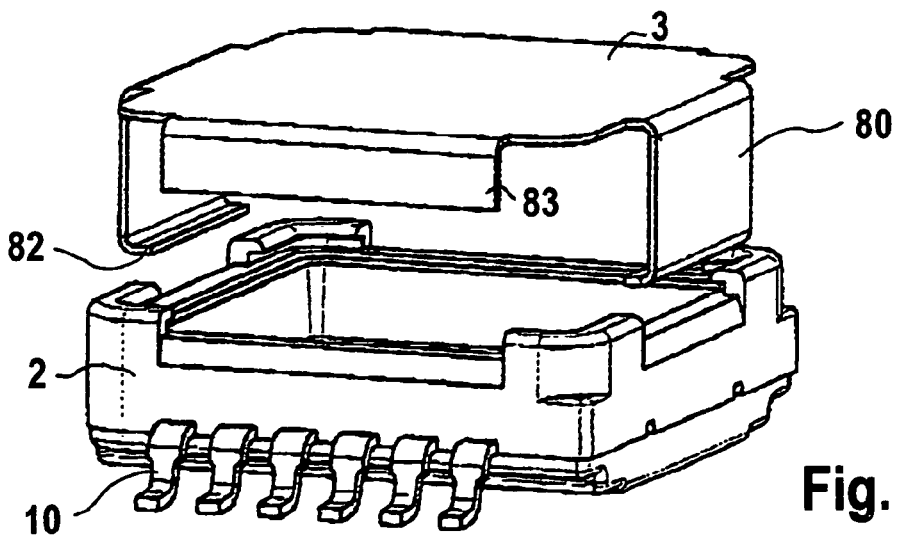

The two other sides of lower housing part 2 may be engaged by lugs 83 of cover 3 as shown to secure cover 3 and prevent it from slipping out of place on lower housing part 2. Cover 3 may in turn be manufactured as a deep-drawn part or by stamping and subsequent bending. This allows quick, simple, yet secure assembly of cover 3 on lower housing part 2 by setting and clamping the cover on lower housing part 2 according to FIGS. 12*c* and 12*a, b*.

In this embodiment, similarly to the example embodiment of FIG. 7*d*, cover 3 may be contacted via its clip arm 80. Furthermore, a bottom 85 of lower housing part 2 may be conductive, so that it is in contact with cover 3 via clip arm 80 and may be used for bonding to the circuit board, for example, on a die pad of the circuit board.

What is claimed is:

1. A sensor module for measuring an acceleration or rotational speed, comprising:
    a housing base body made of a plastic material;
    a lead frame extending through the housing base body and having leads which have connector pins for attachment to a circuit board;
    a cover made of a conductive material and connected to the base body; and
    a sensor system including at least one sensor chip, the sensor system being in contact with the lead frame via conductor bonds, the cover being connected to at least one connector pin of the sensor module;
    wherein the cover is connected to a cover connector pin for connection to the circuit board.

2. The sensor module as recited in claim 1, wherein the cover connector pin is adjacent to a ground pin of the lead frame.

3. The sensor module as recited in claim 1, wherein the cover is connected to a ground lead of the lead frame.

4. The sensor module as recited in claim 3, wherein the lead frame has at least one metallic tab protruding upward, the cover being clamped between the metallic tabs.

5. The sensor module as recited in claim 4, wherein the at least one metallic tab has a bent end.

6. The sensor module as recited in claim 3, wherein the cover is pressed into support devices of the lead frame.

7. The sensor module as recited in claim 6, wherein a lower edge of the cover is pressed into openings in the support devices of the lead frame.

8. The sensor module as recited in claim 6, wherein the support devices are lead forks having at least two metallic tabs at a distance from one another for clamping an inserted cover.

9. The sensor module as recited in claim 3, wherein a bottom of the cover has slots into which lead ends of the lead frame are inserted.

10. The sensor module as recited in claim 3, wherein the cover has openings through which press-in pins of the lead frame are pressed in.

11. The sensor module as recited in claim 1, wherein the base body has a conductive region and insulating regions, the conductive region extending over most of the base body; the cover being placed on the conductive region; ground leads passing through the conductive region, and the insulating regions surrounding further leads of the lead frame and passing through the conductive region.

12. The sensor module as recited in claim 1, wherein the housing base body is made of insulating plastic and molded around the lead frame and the sensor system, and the cover is placed on the housing base body.

13. The sensor module as recited in claim 1, wherein the base body is a premolded lower housing part, and the sensor system is placed into an inner space surrounded by the lower housing part and the cover.

14. The sensor module as recited in claim 13, wherein the sensor system is glued in the inner space.

15. The sensor module as recited in claim 14, wherein the cover is connected to the lower housing part by a form-locked connection.

16. The sensor module as recited in claim 15, wherein the form-locked connection includes a flange of the lower housing part which grips the cover from behind.

17. The sensor module as recited in claim 13, wherein the cover is inserted into the lower housing part.

18. The sensor module as recited in claim 13, wherein the cover is one of a deep-drawn cover or a stamped and bent cover made of metal.

19. The sensor module as recited in claim 13, wherein the cover is connected to the lower housing part by an adhesive bond.

20. The sensor module as recited in claim 13, wherein at least one contact, which is placed into an orifice of the ground lead, is formed or mounted on the cover.

21. The sensor module according to claim 20, wherein the at least one contact is on a cover edge of the cover.

22. The sensor module as recited in claim 20, wherein the at least one contact is pressed into the orifice, corners of the at least one contact being deformed.

23. The sensor module as recited in claim 13, wherein one of the cover edge or the contact is one of welded, soldered, or glued by a conductive adhesive to the ground lead.

24. The sensor module as recited in claim 13, wherein a channel, in which a conductive contact is formed between cover and ground pin, is formed in a housing wall of the premolded lower housing part.

25. The sensor module as recited in claim 24, wherein orifices connected to the channel are formed in at least one of the ground pin and the cover, and the contact extends through the orifices and the channel.

26. The sensor module as recited in claim 25, wherein the conductive contact is a contact pin pressed into the channel.

27. The sensor module as recited in claim 24, wherein the conductive contact is a conductive adhesive contact introduced into the channel.

28. The sensor module as recited in claim 13, wherein the cover is clipped to the lower housing part.

29. The sensor module as recited in claim 28, wherein the cover has a clip arm made of metal, which grips the lower housing part from behind.

30. The sensor module as recited in claim 28, wherein one of the clip arm or a conductive area of the lower housing part contacted by the clip arm, is configured for connection to the circuit board.

* * * * *